(12) United States Patent
Derra et al.

(10) Patent No.: US 7,809,112 B2
(45) Date of Patent: Oct. 5, 2010

(54) METHOD AND DEVICE FOR GENERATING EUV RADIATION AND/OR SOFT X-RAY RADIATION

(75) Inventors: Günther Hans Derra, Aachen (DE); Rolf Theo Anton Apetz, Aachen (DE); Willi Neff, Kelmis (BE); Oliver Rosier, Jüchen (DE); Peter Zink, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 470 days.

(21) Appl. No.: 10/596,441

(22) PCT Filed: Dec. 13, 2004

(86) PCT No.: PCT/IB2004/052769
§ 371 (c)(1),
(2), (4) Date: Aug. 21, 2008

(87) PCT Pub. No.: WO2005/060321
PCT Pub. Date: Jun. 30, 2005

(65) Prior Publication Data
US 2008/0298552 A1 Dec. 4, 2008

(30) Foreign Application Priority Data
Dec. 17, 2003 (DE) ................. 103 59 464

(51) Int. Cl.
H01J 35/06 (2006.01)
H05G 2/00 (2006.01)
(52) U.S. Cl. ...................... 378/122; 378/119
(58) Field of Classification Search ............. 378/119, 378/122, 124, 134, 143; 250/504 R
See application file for complete search history.

(56) References Cited

U.S. PATENT DOCUMENTS 7,427,766 B2 * 9/2008 Jonkers et al. .......... 250/504 R
2006/0113498 A1 * 6/2006 Vaudrevange et al. ... 250/504 R

* cited by examiner

Primary Examiner—Irakli Kiknadze

(57) ABSTRACT

A method of generating in particular EUV radiation (12) and/or soft X-ray radiation (12a) emitted by a plasma (26) is described. The plasma (26) is formed by an operating gas (22) in a discharge space (14) which comprises at least one radiation emission window (16) and an electrode system with at least one anode (18) and at least one cathode (20). This electrode system transmits electrical energy to the plasma (26) by means of charge carriers (24) introduced into the discharge space (14). It is suggested for obtaining a reliable ignition of the plasma (26) at high repetition frequencies that a radiation (30) generated by at least one radiation source (28) is introduced into the discharge space (14) for making available the discharge carriers (24).

30 Claims, 12 Drawing Sheets

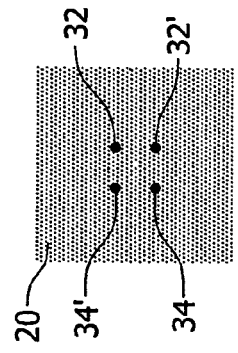
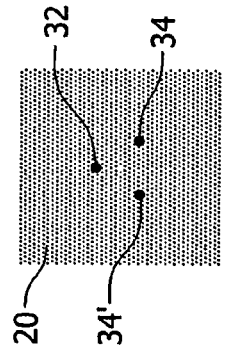
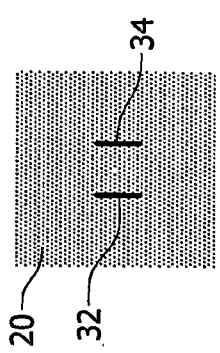
FIG. 3d  FIG. 3e  FIG. 3f  FIG. 3g
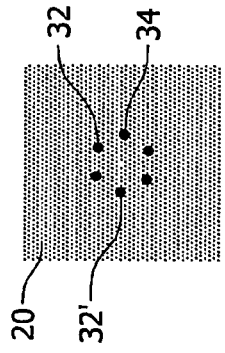
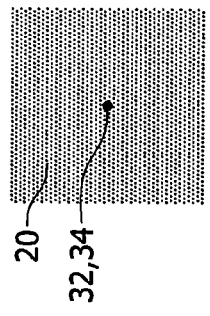
FIG. 3a  FIG. 3b  FIG. 3c
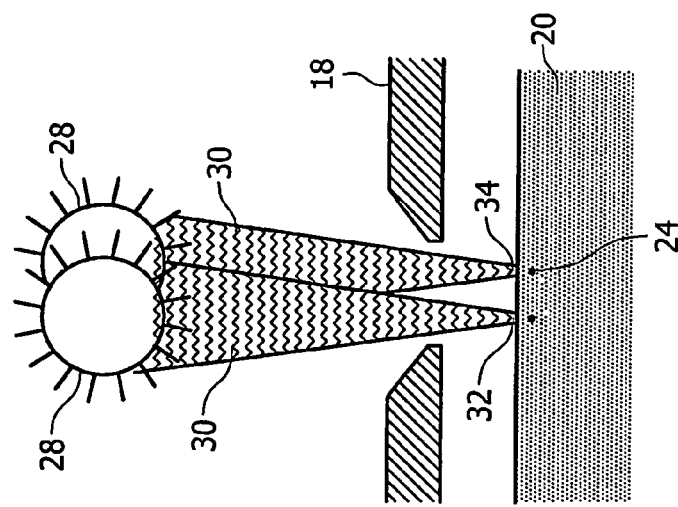
FIG. 3

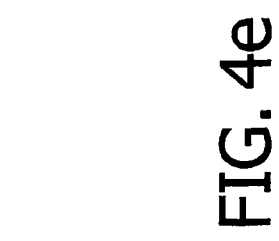
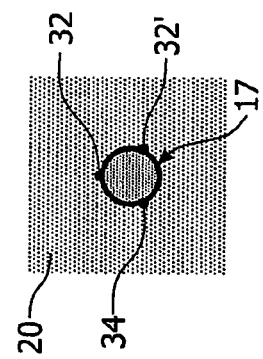
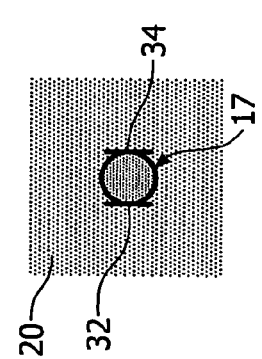
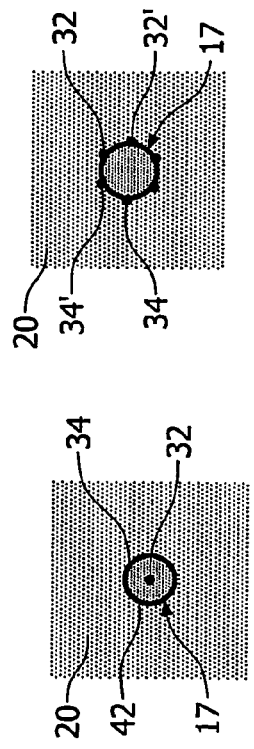
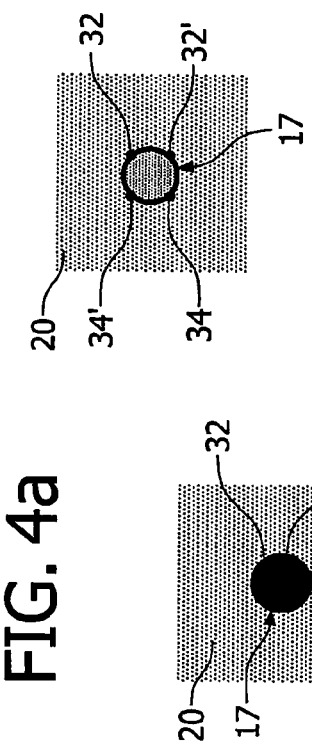
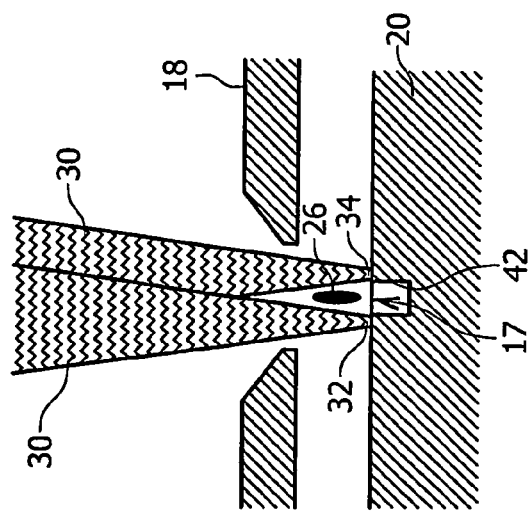

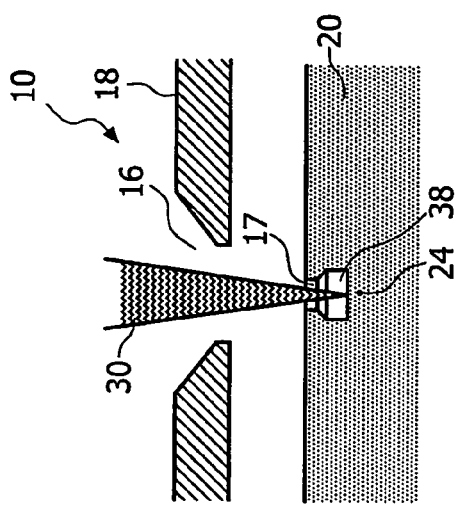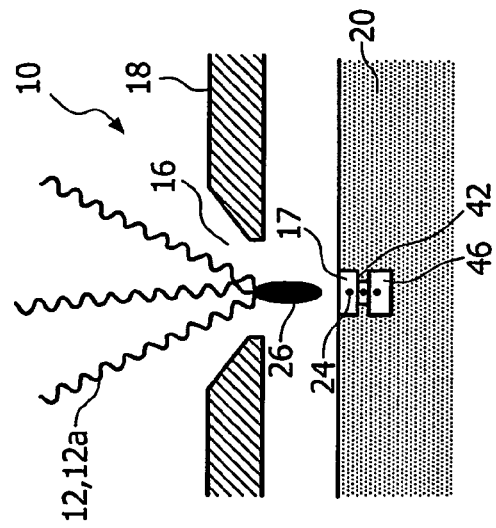
FIG. 5b
FIG. 5d
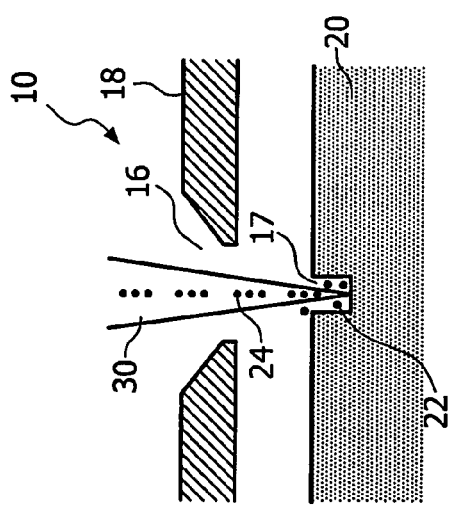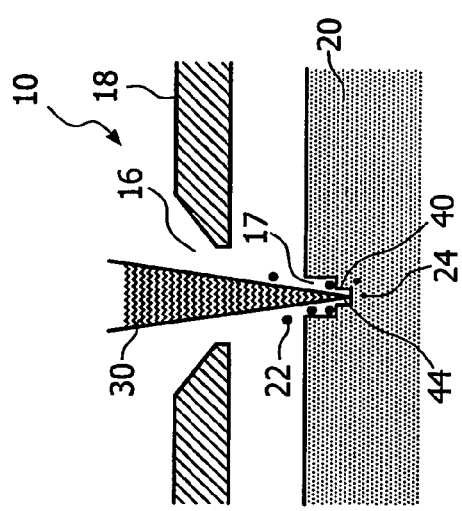
FIG. 5a
FIG. 5c

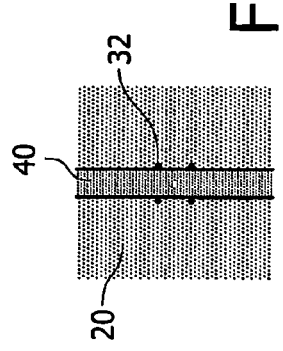
FIG. 7a
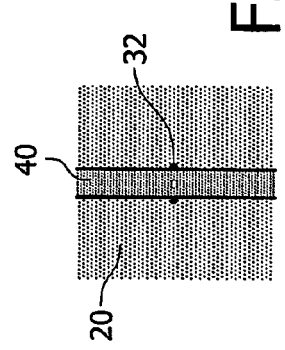
FIG. 7b
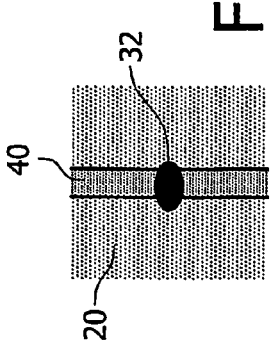
FIG. 7c
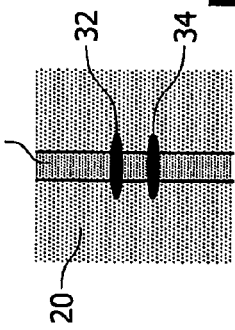
FIG. 7d
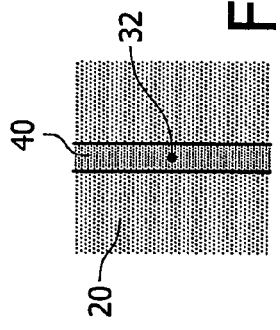
FIG. 7e
FIG. 7f
FIG. 7g
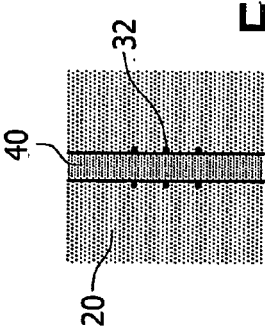
FIG. 7h
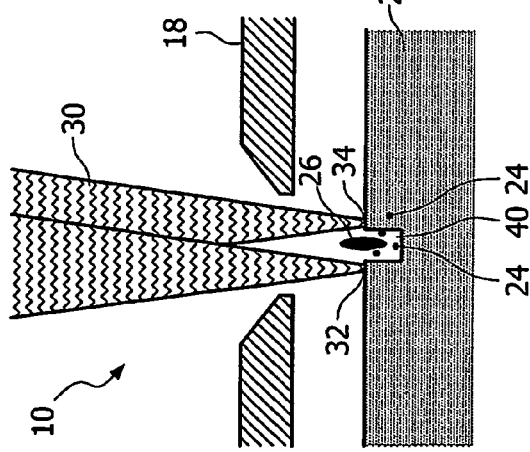
FIG. 7

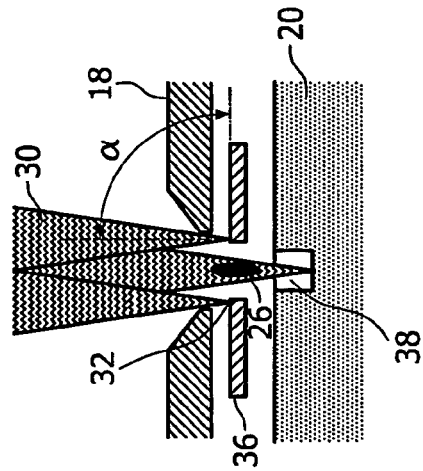
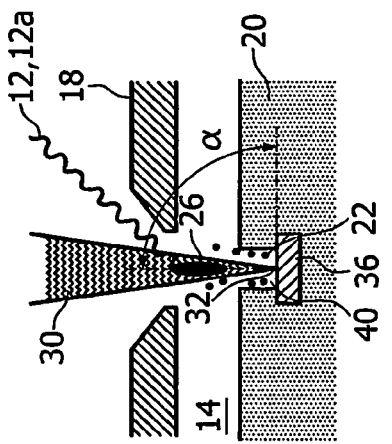
FIG. 8a
FIG. 8b
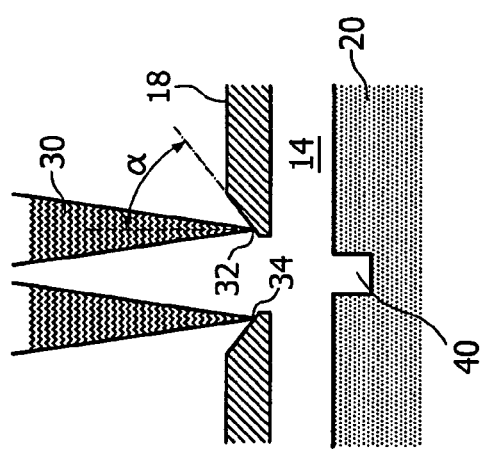
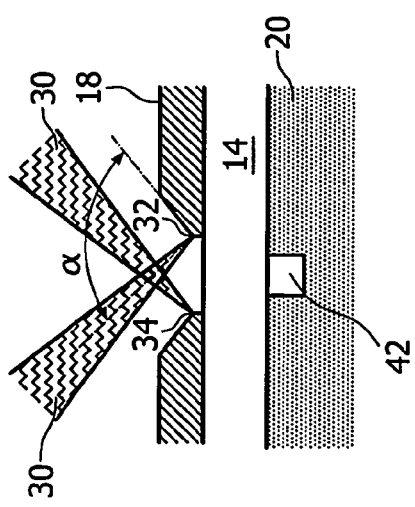
FIG. 8c
FIG. 8d

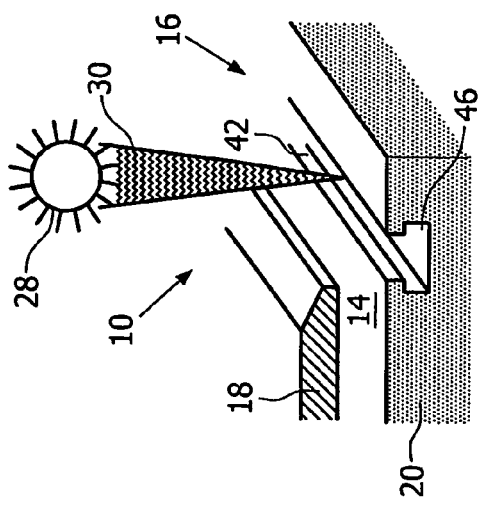
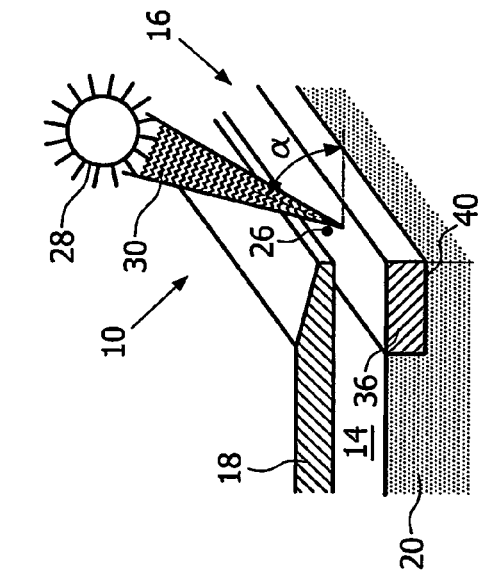
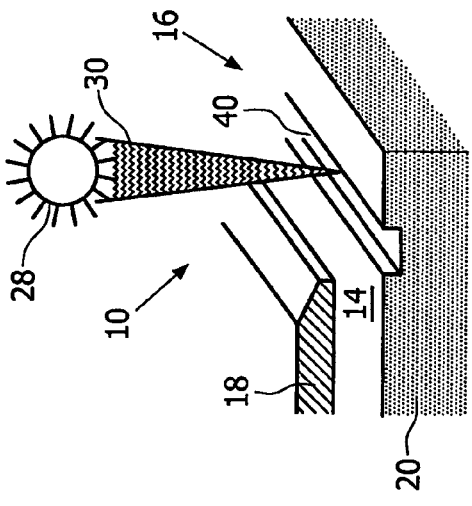# 
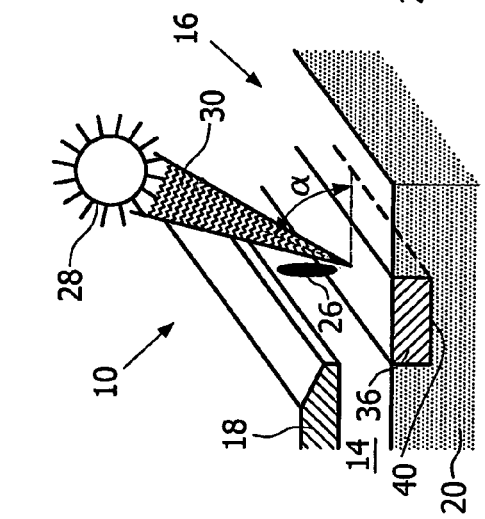
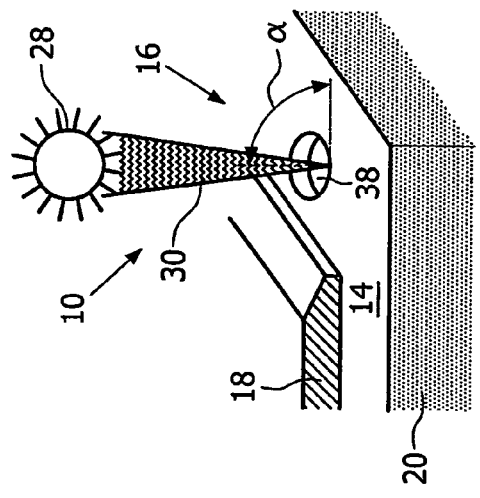
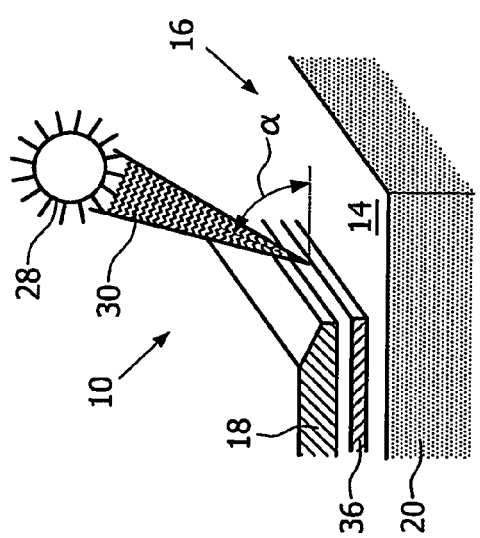
FIG. 12a  FIG. 12b  FIG. 12c
FIG. 12d  FIG. 12e  FIG. 12f

METHOD AND DEVICE FOR GENERATING EUV RADIATION AND/OR SOFT X-RAY RADIATION

The invention relates to a method and a device for generating in particular EUV radiation and/or soft X-ray radiation by means of an electrical gas discharge.

Extreme ultraviolet radiation, EUV radiation for short, and soft X-ray radiation cover a wavelength range from approximately 1 nm to 20 nm. This EUV radiation is designed for use in lithographic processes, mainly in semiconductor manufacture.

Such methods and devices are known. They are based on a plasma generated by means of an electrical gas discharge and emitting EUV radiation and soft X-ray radiation, as is disclosed, for example, in WO-A-01/01736.

Figure 13:
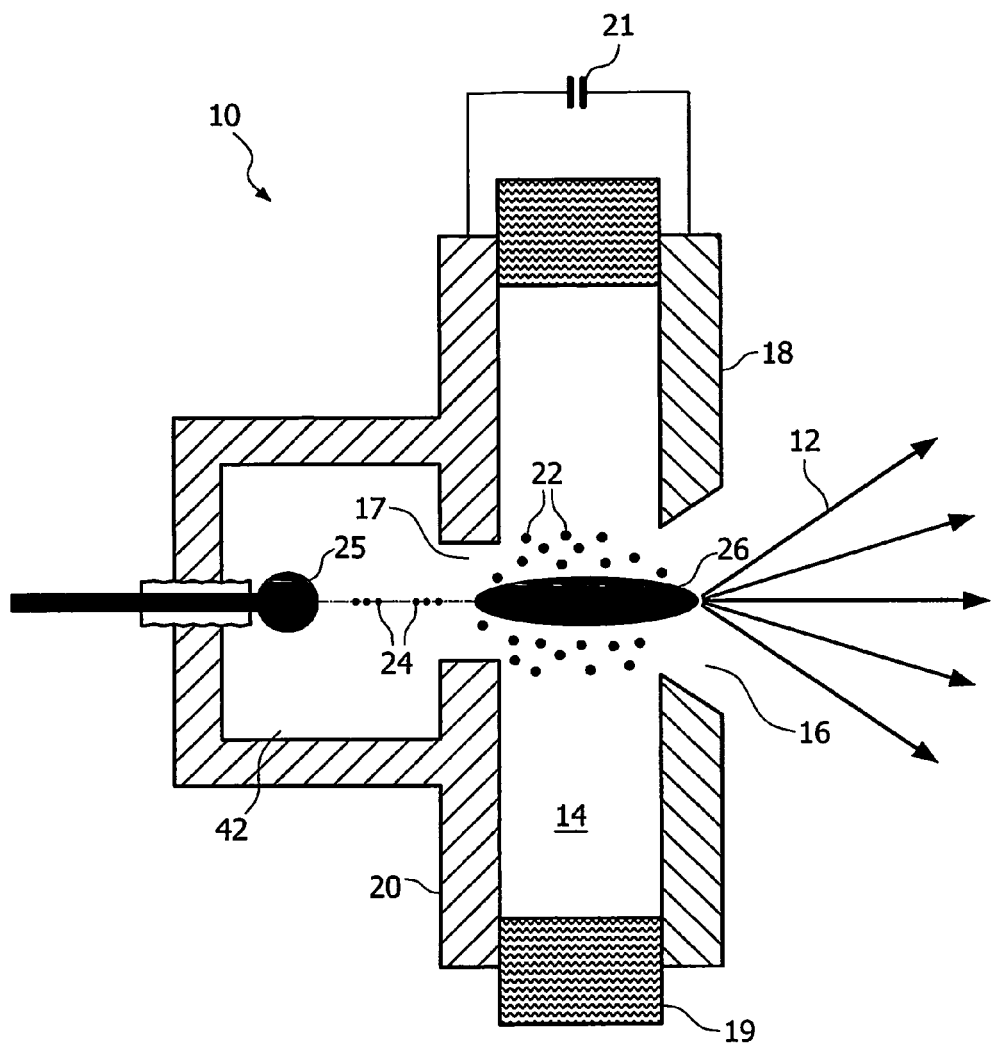

EP-A-1 248 499 describes a method and a device for generating EUV radiation, mentioning measures for a stable generation of the plasma and for controlling the power. The basic operating principle of the present invention will now be clarified with reference to a device of the relevant type as shown in FIG. 13 from EP-A-1 248 499. The device shown in FIG. 13 comprises an electrode system with an anode 18 and a hollow cathode 20. An operating gas 22 is present in a discharge space 14 formed by the electrodes 18, 20 and insulators 19. An operating point for the gas discharge is defined in particular by the pressure prevailing in the discharge space 14, which pressure lies typically in a range from 1 to 100 Pa.

When the power supply 21 applies a periodically switchable current of a few kilo amps up to 100 kilo amps with a pulse duration of a few tens of nanoseconds up to a few hundreds of nanoseconds to the electrodes 18, 20, a so-termed pinch plasma 26 is created which is heated to a certain temperature by ohmic heating and electromagnetic compression and which has a density at which the pinch plasma 26 emits the EUV radiation 12.

The EUV radiation 12 can be coupled out through the radiation emission window 16 in this embodiment. The radiation emission window 16 together with an opening 17 arranged in the cathode 20 and connecting the discharge space 14 to a hollow space 42 defines an axis which is shown with a dash-dot line in FIG. 13. The hollow space 42 mainly serves to make available charge carriers 24 for forming the low-ohmic channel away from the cathode 20.

Typically, the charge carriers 24 are electrons and ions of the plasma which are formed with a high reproducibility in various manners, i.e. by means of a surface discharge trigger, electrical trigger, ferroelectrical trigger, or a pre-ionization of the plasma 26 in the hollow space 42, as shown here. The arrangement of a trigger device 25 on the axis in the hollow space 42 of the cathode 20 renders it possible to release charge carriers 24 by means of a potential control that is comparatively simple to realize.

The gas discharge can thus be operated in the so-termed spontaneous breakdown mode while a current switching element is dispensed with. The power supply 21 charges the electrode system until an operating point defined by the Paschen curve is reached. A potential difference between the auxiliary electrode of the trigger device 25 and the cathode 20 can be reduced by means of the power supply, for example such, that the formation of the low-ohmic channel between the anode 18 and the cathode 20 does not take place. A controlled reduction of the potential of the auxiliary electrode, finally, can control, i.e. trigger a moment for the start of the gas discharge and the formation of the plasma 26.

As a result, plasmas with a high repetition rate and a fast reinstatement of the plasma can be achieved, so that an EUV radiation source with an output power in $2\pi$ in a range from a few tens of Watts up to a few hundreds of Watts is available.

DE-A-101 51 080 suggests the use of high-energy photons and charge carriers obtained from a surface discharge for the controlled generation of the gas discharge. The trigger device disclosed herein is also arranged in a hollow space belonging to one of the electrodes and connected to the discharge space.

These trigger devices as described above, arranged in the immediate spatial vicinity of the plasma, are inevitably exposed to high thermal loads owing to ion bombardment and radiation.

The trigger device 25 shown in FIG. 13 can indeed be cooled, but a comparatively strong erosion of the auxiliary electrode takes place during the subsequent discharge operation, which leads to a shortened product life.

Furthermore, an insufficient number of charge carriers may be present in the hollow space, in particular after a longer operating pause, so that a sufficient pre-ionization is absent and a less effective coupling of the stored electrical energy from the hollow space into the discharge space is obtained. This leads to a less accurate control of an ignition moment for the plasma and to a reduced stability of the gas discharge, also if the gas discharge is operated with high repetition frequencies.

Moreover, a maximum achievable repetition frequency is reduced owing to the charge carriers remaining in the hollow space after the gas discharge, i.e. in that said charge carriers must be eliminated, for example by recombination, before a voltage can once more be applied to the electrode system.

A further problem arises during discharge operation at a frequency of >4 kHz in particular if a small number of charge carriers, or no charge carriers at all are present after a longer operating pause or a new start of the device. The term "operating pause" herein denotes a time span longer than the time span occurring between two discharges during operation.

The present invention accordingly has for its object to provide a method of generating in particular EUV radiation and/or soft X-ray radiation emitted by a plasma formed by an operating gas in a discharge space, which space comprises at least a radiation emission window and an electrode system with at least one anode and at least one cathode, which system transmits electrical energy into the plasma by means of charge carriers introduced into the discharge space, which method renders possible a reliable ignition of the gas discharge at high repetition frequencies and with longer operating pauses by simple means.

This object is achieved in the method of the kind mentioned above, according to the invention, in that at least one radiation generated by at least one radiation source is introduced into the discharge space for making available the discharge carriers.

The incidence of the radiation generated by the radiation source achieves the number of charge carriers required for the reliable triggering of the gas discharge. The radiation source used for this may here be operated outside, i.e. comparatively far removed from the plasma. The radiation source can be protected from thermal loads, ion bombardment by the plasma, EUV radiation, and soft X-ray radiation, so that a longer operational life of the radiation source is safeguarded.

The method may be further developed in that the radiation source generates coherent or incoherent radiation of high energy density, such that charge carriers are released into the discharge space owing to the incidence of the radiation on the electrode system.

For example, a coherent radiation of a laser, or alternatively an incoherent radiation of a flashlight lamp may be introduced into the discharge space through the radiation emission window either directly or via an optical system. Under favorable conditions, a small luminous energy of approximately 1 mJ with a radiation duration of less than 20 ns introduced into the discharge space suffices for igniting the gas discharge and forming the plasma.

The method may also be arranged such that the radiation source generates mass radiation which consists of at least one electron and/or one ion.

For example, an electron or ion source may be directed towards the discharge space such that charged particles generated in a given number and with a given kinetic energy can be introduced.

A particularly advantageous further embodiment of the method provides that the radiation source puts in pulsed radiation with a first radiation path and/or at least one second radiation path simultaneously or mutually shifted in time into the discharge space.

In particular laser sources provide pulsed radiation with variable pulse frequencies up to approximately 10 kHz. Such lasers are commercially available in a compact construction and at a low price. These radiation sources are capable of introducing the radiation into the discharge space either directly or via a suitable optical system. In addition, the introduction of the radiation via different radiation paths can safeguard an improved temporal and spatial distribution of the thermal load through variation of a plasma location. A change of an electrode geometry, which has a negative influence on the efficacy of the plasma generation, is delayed thereby.

So much radiant energy can be introduced into the discharge space through synchronization of several radiation sources via several radiation paths that a more exact dosage of the charge carriers in the discharge space is made possible. The time-shifted introduction of radiation provides an optimization of the formation of the low-ohmic channel and of the plasma formation also during the discharge operation.

A particularly advantageous method is characterized in that the electrode system comprises at least one auxiliary electrode to which an additional potential is applied or which makes available charge carriers or an operating gas by acting as a sacrificial electrode.

The auxiliary electrode can improve the electric field in the discharge space through the application of a variable potential also during the discharge operation, for example in the case of an electrode geometry that has been changed by electrode erosion. The auxiliary electrode may also provide charge carriers or an operating gas suitable for generating EUV radiation and/or soft X-ray radiation in a radiation-induced manner, given a suitable choice of the electrode material. Charge carriers such as ions and electrons are formed particularly readily, for example in a radiation-induced manner, by metals of the first and second main groups, while iodine, indium, tellurium, antimony, and tin may be used as the operating gas.

To improve the reliable ignition of the plasma further, the method is designed such that the radiation is focused on at least one electrode of the electrode system. This leads to a particularly reliable and efficient formation of charge carriers and/or an additional evaporation of electrode material, which may subsequently serve as the operating gas.

To achieve an effective electrode system during discharge operation, the method may provide that the radiation is incident on an electrode that substantially consists of tungsten, molybdenum, iron, copper, tin, graphite, indium, antimony, tellurium, iodine, an alloy or a chemical compound thereof, or steel. If refractory materials, such as tungsten or molybdenum, are used, regions of the electrode system arranged close to the plasma location and/or additionally exposed to radiation can be constructed with particular dimensional stability. Furthermore, these materials may have not only a good electrical conductivity but also an increased thermal conductivity for the removal of the thermal energy.

It is obviously conceivable that these materials merely form a support frame that defines an electrode geometry. A material present in the liquid state under the discharge conditions prevailing in the discharge space may be additionally supplied as required during operation.

The radiation is focused spatially close to the electrode used as the cathode, so that a pre-ionization cloud caused by the incident radiation propagates in the direction of the anode and can initiate the ignition of the plasma.

Furthermore, the method may be arranged such that the radiation is guided onto the electrode in a pattern having a point, circular, annular, or linear shape, and/or a combination thereof. A distribution of the radiation, possibly with a varying intensity, through focusing of the radiation on the electrode in different geometric shapes leads to an increase in the radiant emission and an enhanced stability of the plasma.

To improve the plasma stability further, the method is arranged such that the radiation is introduced into at least one cavity of the affected electrode, which cavity is open towards the discharge space and is bounded by electrode material at least three sides.

It was found that a comparatively large-volume, diffuse plasma is often created by focusing of the radiation onto a planar electrode, so that only a portion of the useful power of the EUV radiation can be coupled into an optical system via the radiation emission window. Moreover, erosion and thermal loading occur to a higher degree at electrode surfaces because of a direct contact with the plasma. The introduction of the radiation into the cavity or the regions adjoining the cavity of an electrode surface makes it possible to align the radiation-induced charge carriers, so that, for example, a reduced plasma volume is created. Furthermore, the plasma location is fixed such that a reproducible discharge can establish itself. A greater distance between the plasma and the electrode surface can also be set, so that little erosion occurs.

To make available a sufficient quantity of operating gas in the discharge space, the method may advantageously be further developed such that the operating gas is introduced into the discharge space by means of a feed duct or an auxiliary ray focused on the electrode.

Besides the materials for the operating gas mentioned above, gases comprising xenon may also be introduced or supplied. The auxiliary ray may be introduced into the discharge space via a second radiation path. It is obviously also possible to introduce a continuous auxiliary ray, or an auxiliary ray that is synchronous or asynchronous with the radiation, having a given intensity by means of a further radiation source.

Advantageously, the method is implemented such that the radiation is introduced into the discharge space via an aperture. This opens up the possibility of introducing the radiation into the discharge space from a radiation source that is arranged, for example, at the rear with respect to the radiation emission. It is obviously also possible to locate the radiation source in the discharge space, given a suitable geometric arrangement of the electrodes.

In a particularly advantageous method, the radiation source is constructed such that the radiation has a wavelength in the UV, IR, and/or visible range. The introduction of UV radiation into the discharge space causes charge carriers to be released from the electrode material with a high efficiency. If IR radiation is introduced, it is in particular the quantity of metal vapor that can be positively influenced.

To adapt the number of charge carriers to the geometric requirements in the discharge space, the method is implemented such that the radiation is incident on the surface of the electrode at an angle of 0° to 90°.

For further optimization of the generation of EUV radiation and/or soft X-ray radiation, it may be provided that a time interval is set between the introduction of the radiation and the transmission of the electric energy, or between the introduction of a or the auxiliary ray and the radiation. The introduction of the radiation into the discharge space causes a pre-ionization cloud which expands in the space between the cathode and the anode. It is not until this time interval has elapsed that an optimum distribution of the pre-ionization cloud is established, i.e. a distribution that leads to an advantageous positioning of the plasma upon the application of the electric current to the operating gas or of a further radiation.

The present invention further has for its object to provide a device for generating in particular EUV radiation and/or soft X-ray radiation, which emits a plasma formed in an operating gas in a discharge space, which space comprises at least one radiation emission window and an electrode system with at least one anode and at least one cathode, wherein electrical energy can be transmitted to a plasma by means of charge carriers that can be introduced into the discharge space, which device is to be improved such that a reliable and well controllable ignition of the gas discharge is safeguarded also at high repetition frequencies and with longer operating pauses.

This object is achieved in a device according to the invention in that at least one radiation source, which introduces at least one radiation into the discharge space, is present for providing the charge carriers.

The radiation source used for triggering may be spatially removed from the plasma such that no thermal loads occur anymore that would reduce the operational life. To this end, for example, the radiation source may be arranged outside the discharge space. The radiation is introduced into the discharge space by means of a suitable optical system, for example through the radiation emission window for the EUV radiation and/or soft X-ray radiation. The radiation source may alternatively be located in the discharge space itself, in which case the electrode shape is chosen such that the radiation source itself is protected against ion bombardment and EUV radiation.

The device may be further developed such that the radiation source generates coherent or incoherent radiation of high energy density, whereby charge carriers can be released into the discharge space through incidence of the radiation on the electrode system.

Such radiation sources for the generation of coherent radiation are, for example, Nd:YAG, $CO_2$, excimer, and diode lasers.

Alternative radiation sources generating incoherent radiation, in particular so-termed flashlight lamps may be arranged such that their radiation is introduced directly or by means of a guiding system, which may be constructed in the form of mirrors or optical waveguide cables. Obviously, radiation sources may also be used which provide both monochromatic radiation and radiation with several wavelengths.

A particularly advantageous embodiment of the device provides that the radiation source generates mass radiation which comprises at least one electron and/or one ion. The charge carriers required for forming the low-ohmic channel and for achieving a reproducible and reliable ignition of the plasma are introduced into the discharge space. The ion here may obviously be either a cation or an anion. In the simplest case, charge carriers are supplied from an electron or ion source arranged in the discharge space. An end of the source open towards the discharge space may be provided, for example, in an insulator.

A particularly advantageous device is constructed such that the radiation source provides pulsed radiation with a first radiation path and/or at least one second radiation path, either simultaneously or mutually shifted in time.

It may be necessary, for example, to introduce radiation with an intensity varying in time in the form of pulses into the discharge space for triggering the gas discharge. The radiation source is for this purpose constructed such that both a pulse duration and frequency and also the intensity can be controlled.

The radiation provided by the radiation source may be introduced into the discharge space, for example, by means of a beam splitter providing a first radiation path and a second radiation path.

This is obviously also possible with the use of a plurality of radiation sources in synchronous or asynchronous radiation operation. It is also possible to introduce radiations of different wavelengths into the discharge space by means of different radiation sources.

For example, an operating gas present between anode and cathode may be additionally ionized by means of radiation that is introduced shifted in time so as to enhance its electrical conductivity in a specified manner. A particularly effective ionization of the operating gas leads to a resonant energy coupling. Finally, the position of the plasma can be stabilized, and a particularly high efficacy of the gas discharge establishes itself.

To improve the stability of the plasma formation further, the device may be constructed such that the electrode system comprises at least one auxiliary electrode. This auxiliary electrode is positioned, for example, between the anode and the cathode in the discharge space. It serves, for example, to regulate or homogenize a change in the electric field caused by erosion of the electrodes during the discharge operation.

A particularly advantageous embodiment of the device provides that the radiation is focused on at least one electrode of the electrode system. For example, the radiation is focused on the auxiliary electrode so as to evaporate electrode material by the incidence of the radiation, which material serves, for example, as the operating gas for the gas discharge. It is no longer necessary here for an operating gas to be continuously present in the discharge space. A possible contamination of optical components in a lithography device by the operating gas particles leaving the discharge space through the radiation emission window is reduced in this manner. In addition, the focusing of the radiation on an electrode leads to an improved pre-ionization, so that a higher reproducibility in igniting the gas discharge is obtained. A focusing of the radiation on the auxiliary electrode in addition makes it possible to spare the anode or cathode that is thermally strongly affected by erosion and radiation.

Furthermore, the device may be constructed such that at least the electrode affected by the radiation is substantially manufactured from tungsten, molybdenum, iron, copper, tin, graphite, indium, tellurium, iodine, an alloy or chemical compound thereof, or steel. Obviously, all electrically conductive materials can be used in principle for the electrode system.

In particular those electrode surfaces that face the discharge space can achieve a longer operational life when an electrode material with a high melting point and a high thermal conductivity is used.

It is furthermore possible to arrange an electrode comprising tin, indium, tellurium, and/or iodine in the discharge space, which electrode acts as a sacrificial electrode when hit by the radiation and provides a vapor serving as the operating gas that emits EUV radiation and/or soft X-ray radiation particularly efficiently upon ignition of the plasma.

A further embodiment of the device provides that the radiation is incident on the electrode in a point, circular, annular, or linear pattern and/or a combination thereof.

For example, an intensity distribution of the radiation focused on a planar electrode can be achieved in dependence on the radiation duration and wavelength by means of a circular pattern with an adjustable diameter. This safeguards a reliable ignition of the plasma and furthermore substantially avoids electrode erosion.

Other planar distributions of the radiation on the electrode positively influence the evaporation rate for generating the operating gas, the volume and expansion rate of the pre-ionization cloud, and/or the number and kinetic energy of the charge carriers.

To stabilize the plasma further, an advantageous further embodiment of the device provides that the electrode affected by the radiation comprises at least one cavity that is open towards the discharge space and that is bounded by electrode material at least three sides.

The charge carriers can be aligned to the extent that the plasma achieves a comparatively small volume, in particular through focusing of the radiation on the cavity or the vicinity thereof. An arrangement of the cavity opposite to the radiation emission window defines an axis of symmetry in the discharge space on which the plasma is located. A further improvement in the positioning of the plasma can be achieved thereby, and a comparatively low-loss coupling-out of the EUV radiation emitted by the plasma through the radiation emission window can be safeguarded.

To minimize the electrode erosion further, the device may be further developed such that the cavity is a blind hole, a groove, or a hollow space of constant or variable diameter, which comprises a depression or an undercut, as desired. For example, focusing of the radiation into a blind hole with one of the types of intensity distribution described above can achieve a more intensive pre-ionization of the operating gas, which leads to a particularly stable operation of the gas discharge and to a small plasma volume.

Focusing of the radiation, for example, on the electrode surfaces adjoining the blind hole renders it possible to distribute a current flow over a larger electrode surface area, so that the interior walls of the blind hole are substantially protected against erosion. Furthermore, the erosion is reduced in the case of a current passage from the electrodes to the plasma by virtue of an enlarged surface area.

By contrast, if a plasma is located spatially close to the electrode surface, the extremely high thermal load will usually lead to a high erosion rate, which considerably reduces the operational life of the electrodes. A groove-type cavity, for example, is capable both of increasing the distance to the plasma and of achieving a larger electrode surface area for a better distribution of the incident thermal energy.

Focusing of the radiation into the hollow space forms a particularly dense pre-ionization cloud, as in the case of the hollow cathode. In addition, the electrode surface area may be further increased by means of the depression or the undercut. The increase in the surface area leads not only to a reduced electrode erosion, but also to an improved, large-surface absorption of the incident radiation energy.

In a particularly advantageous embodiment of the device according to the invention, it is provided that the operating gas can be introduced into the discharge space by means of a feed duct or by means of an auxiliary ray focused at least on one electrode.

Thus a feed duct, for example issuing into the cavity, can serve to improve the gas exchange between the cavity and the discharge space. Any charge carriers and/or ions remaining behind in the cavity after extinction of the plasma are quickly converted by the subsequently inflowing gas. This renders possible a discharge operation with very high repetition rates.

Particles emitting EUV radiation and/or soft X-ray radiation can be introduced particularly efficiently into the discharge space by means of an auxiliary ray focused by the radiation source or a further device on, for example, an auxiliary electrode serving as a sacrificial electrode.

To achieve a particularly compact device, it may be provided that the radiation can be introduced into the discharge space via an aperture. The aperture may be arranged, for example, on the axis defined by the radiation emission window and the cavity, so that the radiation can be introduced parallel to the axis into the discharge space. The radiation source may be located inter alia behind the discharge space, as viewed along the axis from the radiation emission window.

An advantageous embodiment of the above devices is obtained in that the radiation has a wavelength in the UV, IR, and/or visible range. The radiation introduced for triggering the plasma formation may have a wavelength in a arrange from approximately 190 nm to 1500 nm, in which case a reliable ignition of the plasma is safeguarded.

The device may advantageously be further developed such that the radiation is incident on the electrode at an angle of 0° to 90° to the surface thereof.

An absorption of the provided radiation by the operating gas present in the discharge space can be positively influenced during the discharge operation through variation of the angle between the electrode surface and the radiation path, as well as by the positioning of the radiation paths with respect to the electrode surface. In addition, interference effects between the radiation and the EUV radiation and/or soft X-ray radiation can be reduced.

Furthermore, the device may be constructed such that the radiation can be introduced into a symmetrical or asymmetrical discharge space. In a cylindrically symmetrical construction of the discharge space, a homogeneous electric field can be generated upon the application of a voltage by means of a symmetrical electrode system formed by anodes and cathodes, which field can contribute to a stable plasma formation. Their high kinetic energy enables the ions formed in the plasma still to enter the optical system of a lithography device along the axis through the radiation emission window.

An asymmetrical discharge space may be formed, for example, through an asymmetrical arrangement of at least one electrode with respect to the radiation emission window. A substantial portion of the ions generated by the plasma remains in the discharge space or is mainly conducted in a direction away from the radiation emission window.

In a further embodiment of the invention, it is provided that a time interval can be set between the introduction of the radiation and the transmission of the electrical energy, or between the introduction of a or the auxiliary ray and the radiation.

After the radiation has been introduced into the discharge space, the pre-ionization cloud can expand in the space between the electrodes as a result of this. When a favorable distribution and spatial arrangement of the cloud in the discharge space has been reached, the gas discharge can be ignited by the application of a voltage to the cathode and anode. Typically, the adjustable time interval lies in a range from 0 to approximately 1000 ns. One possibility is that a pulsatory current supply is electrically connected to the electrode system, transmitting the electrical energy. The plasma location can be defined and a particularly high conversion efficacy of the coupled-in electrical energy into EUV radiation and/or soft X-ray radiation can be achieved during the discharge operation through optimization of said time interval.

A time interval may also be provided between the introduction of the auxiliary ray and that of the radiation into the discharge space. The auxiliary ray, for example, evaporates a suitable quantity of electrode material, which serves as the operating gas. The radiation is applied later in time so as to provide the necessary charge carriers in the discharge space after the operating gas has been optimally distributed. The adjustable time interval here lies in a range of 0 to approximately 1000 ns.

Figure 1:
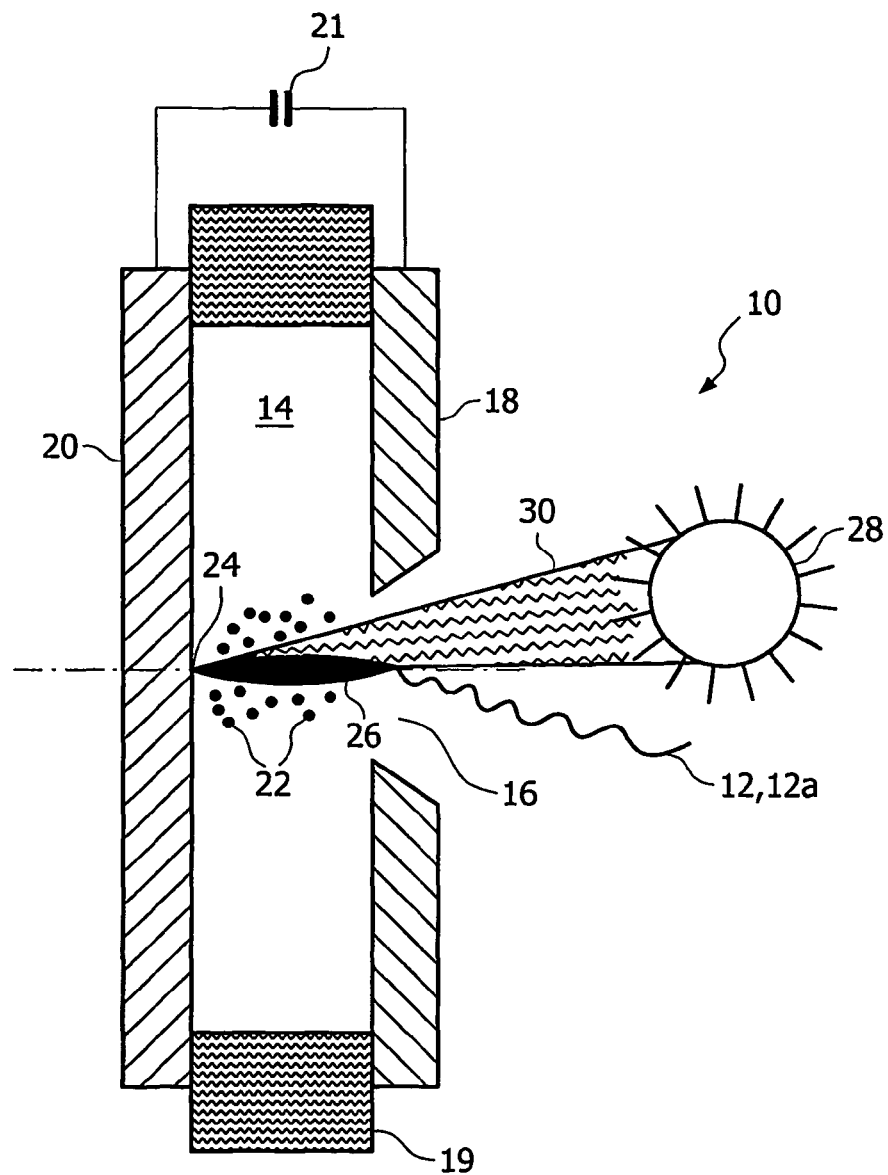
Figure 2A:
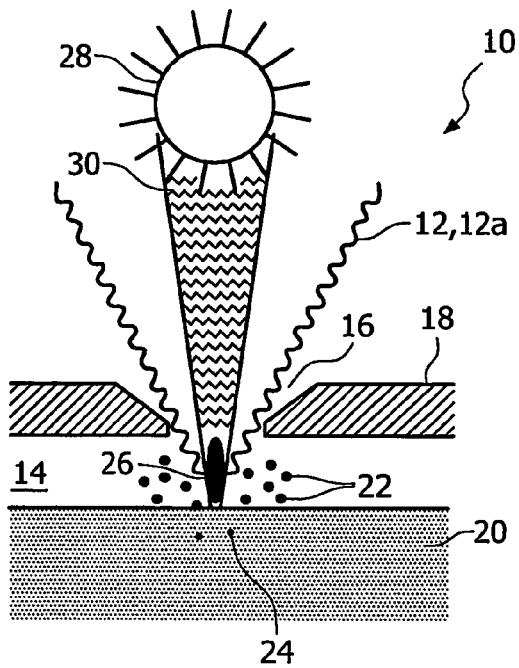
Figure 2B:
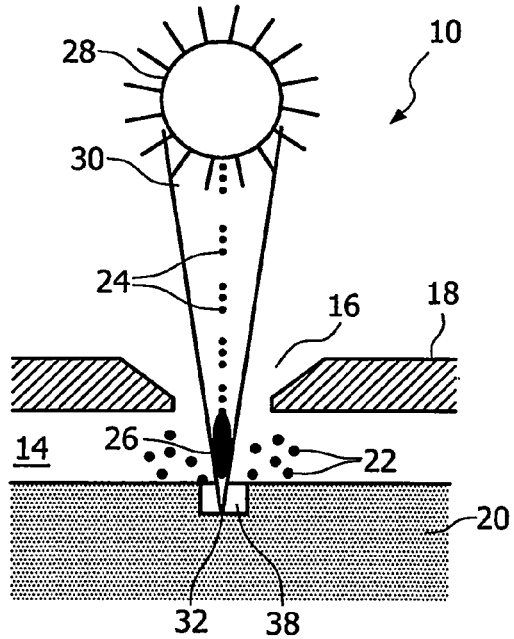
Figure 6B:
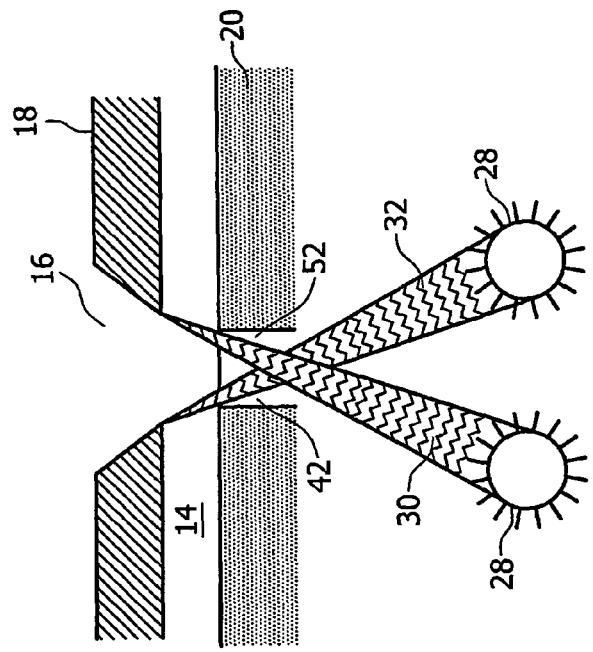
Figure 6A:
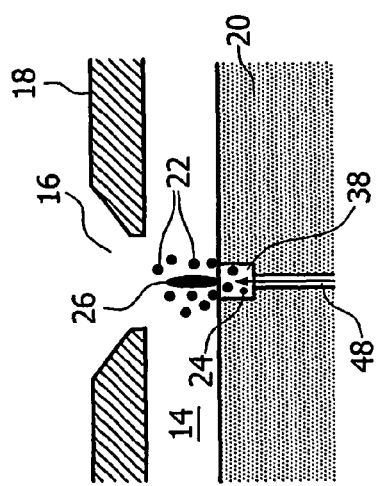
Figure 10:
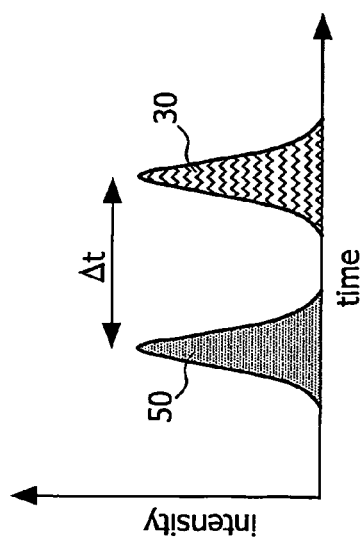
Figure 11A:
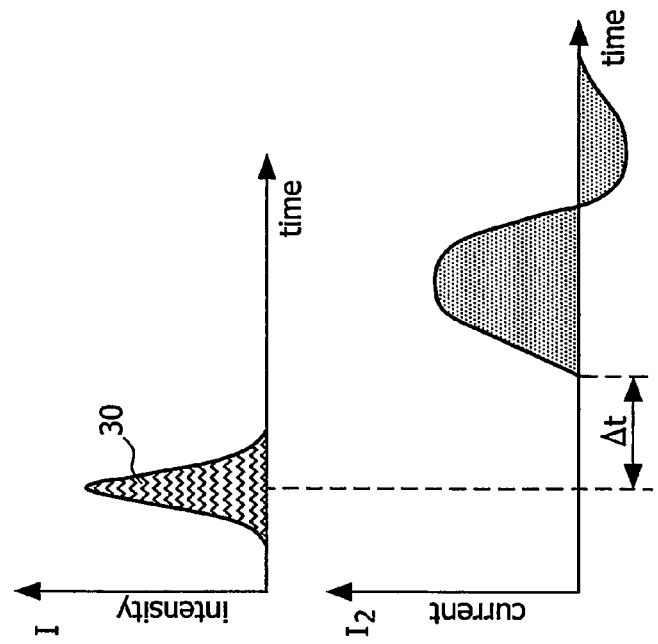
Figure 11:
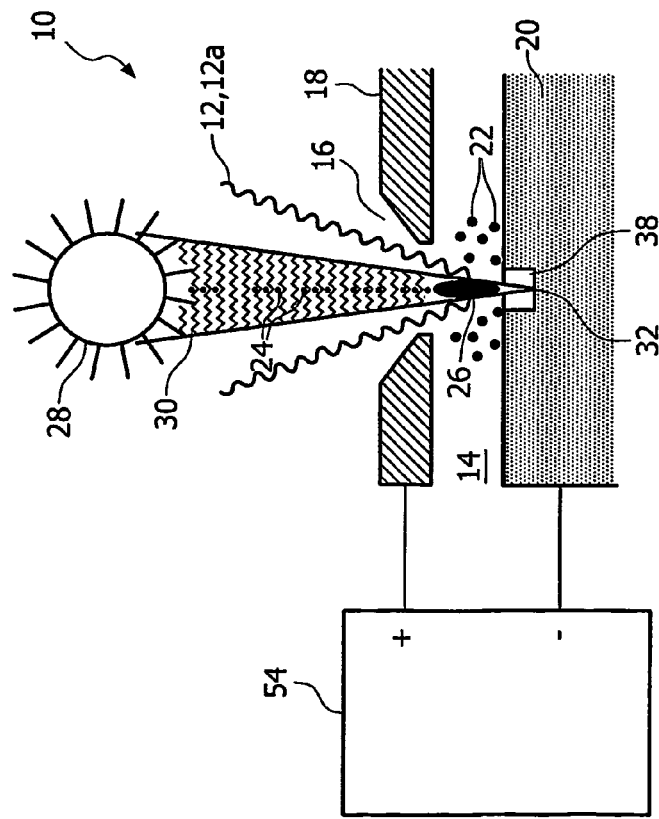

Further features and advantages of the invention will become apparent from the ensuing description of several embodiments and from the drawings to which reference is made and in which:

FIG. 1 is a diagrammatic cross-sectional view of a first embodiment of a device according to the invention;

FIGS. 2a, b, c diagrammatically depict further embodiments of the device with different electrode geometries;

FIGS. 3 and 3a to g show further embodiments of a device according to the invention with differently focused radiations on an electrode surface;

FIGS. 4 and 4a to g show further embodiments of the device according to the invention with radiation focused around and/or in a cavity;

FIGS. 5a to d show further embodiments of the device according to the invention with differently shaped cavities;

FIGS. 6a and b show further embodiments of the device according to the invention with a feed duct and an aperture, respectively;

FIGS. 7 and 7a to h show further embodiments of the device according to the invention with radiation focused around and/or on a groove;

FIGS. 8a to d show further embodiments of the device according to the invention with radiation focused on different electrodes of an electrode system;

FIGS. 9 and 9a to g show further embodiments of a device according to the invention with a first and a second radiation path, focused on an electrode surface and/or in a cavity with patterns of different shapes;

FIG. 10 is a diagram in which a radiation intensity is plotted as a function of time;

FIG. 11 diagrammatically shows a further embodiment of the device according to the invention similar to that of FIG. 2b with a controllable current supply;

FIG. 11a shows diagrams in which the radiant intensity and the current are plotted as a function of time;

FIGS. 12a to f are perspective views of further embodiments of the device according to the invention with an asymmetrical electrode system; and FIG. 13 diagrammatically shows a device of the type discussed according to the prior art.

In the ensuing description of the embodiments, the same reference numerals always refer to the same constructional features and always relate to all Figures, unless stated to the contrary.

FIG. 1 shows a first embodiment of a device 10 according to the invention for generating in particular EUV radiation 12 and/or soft X-ray radiation 12a. The device 10 comprises a discharge space 14 which has at least one radiation emission window 16 and which encloses an electrode system with at least one anode 18 and one cathode 20 as well as insulators 19 at least partly.

The anode 18 and the cathode 20 are arranged such that an electrical energy from a power supply 21 is transmitted to a plasma 26 of an operating gas 22 by means of charge carriers 24 that can be introduced into the discharge space 14, whereupon the plasma 26 emits the EUV radiation 12 and/or soft X-ray radiation 12a.

The charge carriers 24 required for igniting the plasma 26 are made available in the discharge space 14 by at least one radiation source 28 which generates at least one radiation 30. The expression "make available" here means that the radiation 30 either generates the charge carriers 24 or actually comprises the charge carriers 24.

In a second embodiment of the device 10 according to the invention shown in FIG. 2a, the radiation source 28 generates coherent or incoherent radiation 30 with a high energy density, such that charge carriers 24 are made available in a cylindrically symmetrical discharge space 14 through collision of the radiation 30 against the planar cathode 20 of the electrode system. The radiation source 28 may be a laser here, or a flashlight lamp which generates monochromatic radiation 30 or radiation distributed over a wavelength range.

In a third embodiment shown in FIG. 2b, the radiation source 28 makes available mass radiation 30 which comprises at least one electron and/or one ion. The radiation source 28 may here be an electron or ion source which introduces a pulsed radiation 30 with a first radiation path 32 into the discharge space 14 with its symmetrical arrangement of the electrode system. The radiation 30 is focused on a blind hole 38 of the cathode 20. The pulsed introduction of the radiation 30, which introduces charge carriers 24 in the form of electrons into the discharge space 14 with varying intensity in time, is capable of triggering a plasma 26. Typically, one radiation pulse is shorter than approximately 100 ns, and one radiation energy pulse introduces between approximately 0.2 and 200 mJ into the discharge space 14.

Figure 2C:
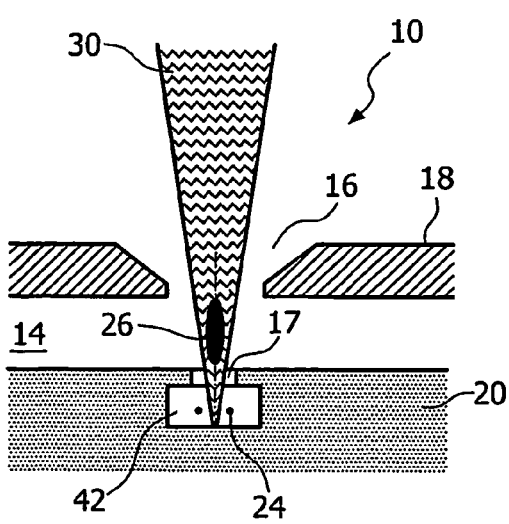

It is apparent from FIG. 2c, which shows a further embodiment, that the radiation 30 is focused in a hollow space 42 in the cathode 20. An introduction of the radiation 30 into a cavity that is open towards the discharge space 14 and is bounded by electrode material at least three sides, as shown here in the shape of the hollow space 42, leads to a pre-ionization cloud which renders possible a directional expansion of the radiation-induced charge carriers 24 in the hollow space 42 via an opening 17, whereby a plasma 26 of particularly small volume is created. The opening 17 and the radiation emission window 16 in addition define an axis of symmetry which serves to define a plasma location.

In the further embodiment shown in FIG. 3, a radiation 30 with a first radiation path 32 and a second radiation path 34 is focused on a cathode 20. Obviously the radiation 30 may be introduced simultaneously, i.e. synchronously, via the two radiation paths 32, 34 shown here by means of one or several radiation sources 28. In addition, one or several radiation sources 28 may introduce the radiation 30 shifted in time, i.e. asynchronously, via a first radiation path 32 and a second radiation path 34 into the discharge space 14. If the radiation 30 hits on spatially mutually removed regions of an electrode surface, as shown in FIGS. 3d to 3g, a given intensity distribution of the radiation 30 over the cathode 20 may be achieved, such that an optimum number of charge carriers 24 in combination with a minimum erosion of the cathode 20 can be achieved.

As FIG. 3a shows, the radiation 30 may be focused on an electrode surface in a point shape. A point-shaped concentration of the radiation 30 here leads to a reliable ionization and/or evaporation of electrode material.

The radiation 30 following the first radiation path 32 may alternatively be focused onto a comparatively large area, as shown in FIG. 3b, for example if a radiation 30 having a short wavelength in the UV range is introduced. It is apparent from FIG. 3c that the radiation 30 may also be focused in a circular pattern on the electrode surface, the diameter thereof being varied during the discharge operation such that an optimum number of charge carriers 24 is introduced into the discharge space 14. Obviously, irregular patterns and patterns alternating during operation may also be imaged on one or several electrodes.

In FIGS. 3d to g, the radiation 30 can be focused via a first radiation path 32 on the electrode surface such that triangular, quadrangular, and hexagonal punctiform or linear patterns arise via a first radiation path 32, 32' and a second radiation path 34, 34'. This may obviously also be achieved by means of even more radiation paths.

FIG. 4 shows that the radiation 30 is focused on a cathode 20, which has a cavity in the form of a hollow space 42, via a first radiation path 32 and a second radiation path 34.

It is apparent from FIGS. 4a to g that the radiation 30 can be focused on the electrode surface such that the radiant intensity can be focused into the hollow space 42 of FIG. 4a. In FIG. 4b, the radiation is incident on a region of the electrode surface in which the cavity is present. In the embodiment shown in FIG. 4c, the radiation 30 is focused both on the cavity and on the region around the cavity. The radiation 30 is incident close to the cavity in FIGS. 4d to 4g. As is visible in FIGS. 4a to g, the cavities have circular openings 17 towards the discharge space 14. The opening 17 may obviously also have any other symmetrical or asymmetrical shape.

The cavity in particular enlarges the electrode surface area, which results in a better distribution and removal of a thermal energy transmitted by the plasma 26. For example, a current distributed over a large area can be conducted into the plasma 26, and an erosion in the cavity can be reduced in that the radiation 30 is focused on the electrode surface spatially adjacent to the cavity.

FIGS. 5a to d show further embodiments of the device 10 with an electrode system that is rotationally symmetrical with respect to the radiation emission window 16. The radiation emission window 16 and the opening 17 define an axis for laying down the plasma location. The opening 17 issues, for example, into a blind hole 28, a groove 40, or a hollow space 42 in which a pre-ionization of the operating gas 22 takes place when the radiation 30 is applied.

The groove 40 shown in FIG. 5c comprises, for example, a depression 44 for a more effective radiation-induced formation of charge carriers 24. In addition, for example, a hollow space 42 with an undercut 46 for forming a pre-ionization chamber may be provided in the electrode, a cathode 20 in the case of FIG. 5d.

The charge carriers 24 issuing through the opening 17 have a translational movement in a direction towards the radiation emission window 16, so that a plasma 26 with a stable location can be ignited whose emitted EUV radiation 12 and/or soft X-ray radiation 12a can be coupled out via the radiation emission window 16 with comparatively low losses.

As FIG. 6a shows, a feed duct 48 may be connected to the cavity so as to introduce an operating gas 22 into the discharge space 14. The operating gas 22 may be dosed as required for igniting the plasma 26 without having to be present in the discharge space 14 continuously, whereby a contamination of optical components of a lithography device by the operating gas 22 flowing out from the radiation emission window 16 is reduced.

Furthermore, a higher frequency in generating the plasma can be realized, because any residual charge carriers 24 are eliminated by the operating gas 22 still flowing out through the feed duct 48. A waiting time for a recombination of the residual charge carriers 24, which usually considerably slows down the repetition rate, is reduced thereby.

In the embodiment shown in FIG. 6b, the radiation 30 of a radiation source 28 is coupled into the electrode system via an aperture 52. The radiation 30 is focused spatially close to the cathode 20 and the plasma location on the anode 18 here. When the radiation 30 hits the anode 18, a pre-ionization cloud is formed which creates a low-ohmic channel for an effective coupling of the electrical energy via the electrode system.

In the embodiment shown in FIG. 7 of the device 10 according to the invention, the radiation 30 is directed to a continuous groove 40.

FIGS. 7a to h show a few patterns on which a first radiation path 32 and a second radiation path 34 are focused. Extremely high thermal loads and strong electrode erosion take place in particular in the case of plasmas of high radiant intensity. A continuous groove 40 is capable of enlarging the electrode surface area such that it provides a better heat transmission as well as a sufficient number of charge carriers 24 for a reliable ignition of the plasma 26.

FIGS. 8a to d show that the radiation 30 is focused on various electrodes. The radiation 30 here is incident on the electrode system at an angle α of 0° to 90°. A variation of the angle α may be used, for example, for controlling the location and size of the pre-ionization cloud in response to demand when the radiation 30 is focused on the anode 18, as shown in FIGS. 8a and 8b.

The radiation 30 as shown in FIGS. 8b and 8d may be focused on an auxiliary electrode 36. The auxiliary electrode 36 is arranged in the intervening space between the electrodes in FIG. 8b and may be connected to an additional electrical potential for enhancing the plasma stability. In the embodiment shown in FIG. 8b, the radiation 30 is focused both on the auxiliary electrode 36 and on the cathode 20.

The auxiliary electrode 36 is provided in a groove 40 in the embodiment shown in FIG. 8d. When the radiation 30 is incident thereon, a quantity of material can be evaporated which serves as the operating gas 22.

The electrodes 18, 20 and possibly 36 affected by the radiation 30 essentially comprise tungsten, molybdenum, iron, copper, tin, graphite, indium, antimony, tellurium, iodine, an alloy or chemical compound thereof, or steel. A high proportion of refractory elements, such as tungsten or molybdenum, is capable of substantially avoiding an erosion of the electrodes during the discharge operation and of ensuring a very stable geometry of the discharge space 14. A further stabilization of the plasma generation is rendered possible thereby. A high thermal conductivity of the electrode material, for example in the case of copper, provides that the thermal energy transmitted by the plasma 26 can be particularly quickly removed.

In the case of an auxiliary electrode 36 comprising tin, as shown in FIG. 8d, an operating gas 22 emitting EUV radiation 12 and/or soft X-ray radiation 12a with a high efficacy with respect to the coupled-in electrical energy in the plasma 26 can be introduced into the discharge space 14 by means of the applied radiation 30.

Figure 9:
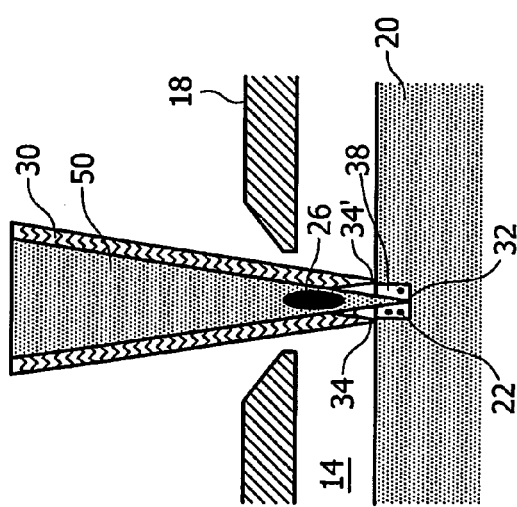
Figure 9A:
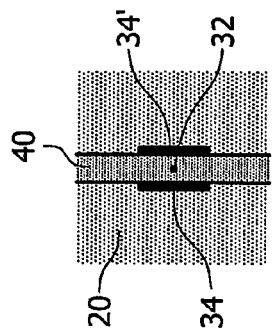
Figure 9B:
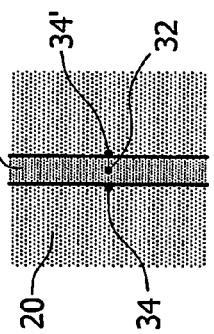
Figure 9C:
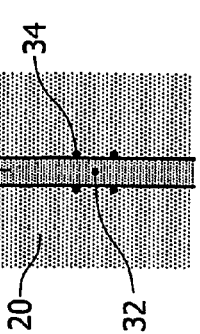
Figure 9D:
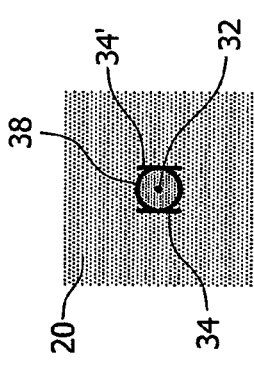
Figure 9E:
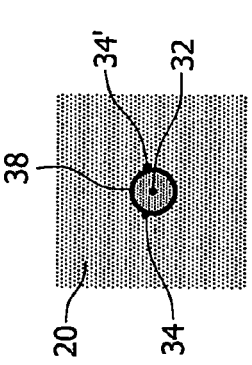
Figure 9F:
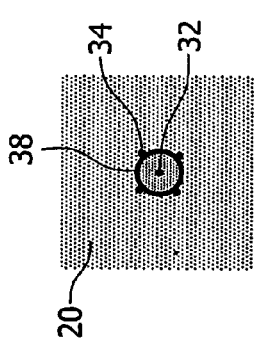
Figure 9G:
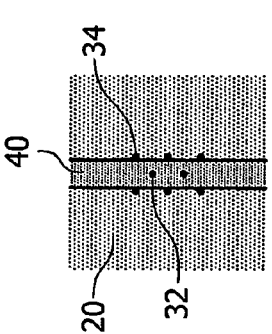

A further embodiment of the device 10 according to the invention shown in FIG. 9 provides an auxiliary ray 50 which can be focused into a blind hole 38 via a first radiation path 32. The wavelength, pulse duration, and focusing thereof during the discharge operation can be adjusted such that an evaporating electrode material enters the discharge space 14 as the operating gas 22. After a time delay which serves to achieve an optimum distribution of a pre-ionization cloud formed in the blind hole 38 under the influence of the radiation, radiation 30 is introduced via a second radiation path 34, 34' into the discharge space 14 so as to initiate the ignition of the plasma 26 and to define a point of application for the current for transmitting the electrical energy to the plasma 26.

The radiation paths 32, 34, 34' shown in FIGS. 9a to g of the radiation 30 focused on the electrode surface and of an auxiliary ray 50, as applicable, form point-shaped or linear patterns, for example, which are focused close to or in the cavity. A sufficiently large number of charge carriers 24 can be generated in the pre-ionization cloud in addition to an optimum radiation-induced evaporating quantity of electrode material serving as the operating gas 22 as a result of a suitable geometrical arrangement of the patterns created by the first radiation path 32 and the second radiation path 34 in combination with a low electrode erosion. This is true in particular if the radiation 30 is also passed along the radiation paths 32, 34 shifted in time.

FIG. 10 plots the radiant intensity of the auxiliary ray 50 and of the radiation 30 as a function of time. The area below the intensity distribution of the auxiliary ray 50 represents the energy coupled in for evaporating and ionizing the electron material serving as the operating gas 22.

A time interval $\Delta t$ of substantially between 0 and 1000 ns lies between the maximum intensity of the auxiliary ray 50 and that of the radiation 30, so as to ensure an emission region of small volume that is distributed as homogeneously as possible upon the ignition of the plasma 26 by the radiation 30 introduced into the discharge space 14.

FIG. 11 shows a further embodiment of a device 10 according to the invention in which a radiation source 18 introduces charge carriers 24 into the discharge space 14 in a pulsed operation. The radiation 30 is focused on a blind hole 38 in the cathode 20 via a first radiation path 32. After a time interval $\Delta t$ a pre-ionization cloud has expanded optimally into the discharge space 14. A pulsatory current supply 54 electrically connected to the anode 18 and the cathode 20 ignites the plasma 26 and provides an effective current flow into the plasma 26 thus formed so as to emit EUV radiation 12 and/or soft X-ray radiation 12a from the discharge space 14 via the radiation emission window 16.

According to the diagram shown in FIG. 11a, radiation 30 is introduced into the discharge space 14 in a first step. After a time interval $\Delta t$ of substantially between 0 and 1000 ns, a current variable in time is coupled in through the low-ohmic channel provided by the ionization cloud.

FIGS. 12a to f show further embodiments of the device 10 according to the invention comprising an asymmetrical discharge space 14.

In the embodiment shown in FIG. 12a, the radiation 30 generated by the radiation source 28 is focused in a circular blind hole 38 of the cathode 20.

In the embodiment shown in FIG. 12b, the radiation 30 is incident on a continuous groove 40.

In the embodiment of FIG. 12c, the radiation 30 is directed at a hollow space 42 which has an undercut 46. The radiation is incident on the electrode surface at an angle $\alpha$ of 90° in these three embodiments.

In the embodiment shown in FIG. 12d, a radiation 30 with a wavelength in the IV, IR, and/or visible range is incident on an auxiliary electrode 36 at an angle $\alpha$ of approximately 45°, which auxiliary electrode is arranged asymmetrically with respect to the radiation emission window 16 in the discharge space 14.

The radiation source 28 of the embodiment shown in FIG. 12e is arranged such that a radiation 30, for example having a wavelength of 1064 nm and generated by a neodymium-YAG laser, is incident on an electrode surface of an auxiliary electrode 36 arranged in a groove 40 of the cathode 20 at an angle of approximately 20°.

The auxiliary electrode 36 provided in the groove 40 of the cathode 20 may be covered by an anode 18, as the embodiment of FIG. 12f shows. As a result, the radiation 30 having a wavelength of up to 1500 nm can be introduced into the discharge space 14 at an acute angle $\alpha$.

An asymmetrical arrangement of the discharge space 14 in the embodiments shown in FIGS. 12a to f leads to a spatial arrangement of the plasma 26 in which the ionized particles are preferentially accelerated in the electric field in an angular range of 60° to 90° with respect to the electrode surface affected by the radiation 30. It is possible by means of a staggered arrangement of the radiation emission window 16 with respect to the preferred direction of the particles to couple the EUV radiation 12 and/or soft X-ray radiation 12a emitted by the plasma 26 into an optical system at an observed angle smaller than approximately 60° with respect to the affected cathode 20, while the particles are essentially held back in the asymmetrical discharge space 14. A reduction in the contamination of the optical system may thus be achieved.

The present invention presents a method and a device for the generation of EUV radiation and/or soft X-ray radiation which render possible a reliable ignition of the gas discharge at high repetition frequencies by simple technical means.

LIST OF REFERENCE NUMERALS 10 device
12 EUV radiation
12a soft X-ray radiation
14 discharge space
16 radiation emission window
17 opening
18 anode
19 insulator
20 cathode
21 power supply
22 operating gas
24 charge carriers
25 triggering device
26 plasma
28 radiation source
30 radiation
32, 32' first radiation path
34, 34' second radiation path
36 auxiliary electrode
38 blind hole
40 groove
42 hollow space
44 depression
46 undercut
48 feed duct
50 auxiliary ray
52 aperture
54 pulsatory current supply
$\alpha$ angle
$\Delta t$ time interval
I radiant intensity

The invention claimed is:

1. A method of generating EUV radiation and/or soft X-ray radiation emitted by a plasma formed by an operating gas in a discharge space comprising at least a radiation emission window and an electrode system with at least one anode and at least one cathode, the system transmitting electrical energy into the plasma by means of charge carriers introduced into the discharge space, wherein at least one radiation generated by at least one radiation source is introduced into the discharge space for providing the charge carriers.

2. A method as claimed in claim 1, wherein the radiation source generates coherent or incoherent radiation of high energy density, such that the charge carriers are released into the discharge space owing to the incidence of the radiation on the electrode system.

3. A method as claimed in claim 1, wherein the radiation source generates mass radiation comprising at least one electron and/or one ion.

4. A method as claimed in claim 1, wherein the radiation source puts in pulsed radiation with a first radiation path and/or at least one second radiation path simultaneously or mutually shifted in time into the discharge space.

5. A method as claimed in claim 1, wherein the electrode system comprises at least one auxiliary electrode to which an additional potential is applied or which provides the charge carriers or an operating gas by acting as a sacrificial electrode.

6. A method as claimed in claim 1, wherein the radiation is focused on at least one electrode of the electrode system.

7. A method as claimed in claim 1, wherein the radiation is incident on an electrode comprising a material selected from the group consisting of: tungsten, molybdenum, iron, copper, tin, graphite, indium, antimony, tellurium, iodine, and steel.

8. A method as claimed in claim 1, wherein the radiation is guided onto the electrode in a pattern having a point, circular, annular, or linear shape, and/or a combination thereof.

9. A method as claimed in claim 1, wherein the radiation is introduced into at least one cavity of the electrode, which cavity is open towards the discharge space and is bounded by electrode material at least three sides.

10. A method as claimed in claim 1, wherein the operating gas is introduced into the discharge space by means of a feed duct or an auxiliary ray focused on the electrode.

11. A method as claimed in claim 1, wherein the radiation is introduced into the discharge space via the radiation emission window or via an aperture.

12. A method as claimed in claim 1, wherein the radiation has a wavelength in the UV, IR, and/or visible range.

13. A method as claimed in claim 1, wherein the radiation is incident on the surface of the electrode at an angle ($\alpha$) of 0° to 90°.

14. A method as claimed in claim 1, wherein a time interval ($\Delta t$) is set between the introduction of the radiation and the transmission of the electrical energy, or between the introduction of a or the auxiliary ray and the radiation.

15. A device for generating EUV radiation and/or soft X-ray radiation, the device emitting a plasma formed in an operating gas in a discharge space comprising at least one radiation emission window and an electrode system with at least one anode and at least one cathode, wherein electrical energy is transmitted to the plasma by means of charge carriers being introduced into the discharge space, wherein at least one radiation source, which introduces at least one radiation into the discharge space, is present for providing the charge carriers.

16. A device as claimed in claim 15, wherein the radiation source generates coherent or incoherent radiation of high energy density, whereby the charge carriers are released into the discharge space through incidence of the radiation on the electrode system.

17. A device as claimed in claim 15, wherein the radiation source generates radiation to be afflicted with mass which comprises at least one electron and/or one ion.

18. A device as claimed in claim 15, wherein the radiation source provides pulsed radiation with a first radiation path and/or at least one second radiation path, either simultaneously or mutually shifted in time.

19. A device as claimed in claim 15, wherein the electrode system comprises at least one auxiliary electrode.

20. A device as claimed in claim 15, wherein the radiation is focused on at least one electrode of the electrode system.

21. A device as claimed in claim 20, wherein at least the electrode affected by the radiation comprises a material selected from the group consisting of: tungsten, molybdenum, iron, copper, tin, graphite, indium, tellurium, iodine, and steel.

22. A device (10) as claimed in claim 15, wherein the radiation is incident on the electrode in a point, circular, annular, or linear pattern and/or a combination thereof.

23. A device as claimed in claim 15, wherein the electrode affected by the radiation comprises at least one cavity that is open towards the discharge space and that is bounded by electrode material at least three sides.

24. A device as claimed in claim 23, wherein the cavity is a blind hole, a groove, or a hollow space of constant or variable diameter, which comprises a depression or an undercut.

25. A device as claimed in claim 15, wherein the operating gas is introduced into the discharge space by means of a feed duct or by means of an auxiliary ray focused at least on one electrode.

26. A device as claimed in claim 15, wherein the radiation is introduced into the discharge space via an aperture.

27. A device as claimed in claim 15, wherein the radiation has a wavelength in the V, IR, and/or visible range.

28. A device as claimed in claim 15, wherein the radiation is incident on the electrode at an angle ($\alpha$) of 0° to 90° to the surface thereof.

29. A device as claimed in claim 15, wherein the radiation is introduced into a symmetrical or asymmetrical discharge space.

30. A device as claimed in claim 15, wherein a time delay ($\Delta t$) is set between the introduction of the radiation and the transmission of the electrical energy, or between the introduction of a or the auxiliary ray and the radiation.

* * * * *